(12) United States Patent
Caicedo Panqueva et al.

(10) Patent No.: US 12,107,069 B2
(45) Date of Patent: Oct. 1, 2024

(54) METHOD FOR MANUFACTURING A STRUCTURE

(71) Applicant: COMMISSARIAT A L'ENERGIE ATOMIQUE ET AUX ENERGIES ALTERNATIVES, Paris (FR)

(72) Inventors: Nohora-Lizeth Caicedo Panqueva, Grenoble (FR); Abdenacer Ait-Mani, Grenoble (FR); Guillaume Nonglaton, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 454 days.

(21) Appl. No.: 17/441,879

(22) PCT Filed: Mar. 13, 2020

(86) PCT No.: PCT/FR2020/050531
§ 371 (c)(1),
(2) Date: Sep. 22, 2021

(87) PCT Pub. No.: WO2020/193903
PCT Pub. Date: Oct. 1, 2020

(65) Prior Publication Data
US 2022/0189910 A1 Jun. 16, 2022

(30) Foreign Application Priority Data
Mar. 25, 2019 (FR) ...................................... 1903041

(51) Int. Cl.
*H01L 21/56* (2006.01)
*H01L 23/00* (2006.01)

(52) U.S. Cl.
CPC ............ *H01L 24/83* (2013.01); *H01L 21/563* (2013.01); *H01L 24/26* (2013.01); *H01L 24/13* (2013.01);
(Continued)

(58) Field of Classification Search
CPC ....... H01L 24/83; H01L 21/563; H01L 24/26; H01L 24/13; H01L 24/16; H01L 24/29;
(Continued)

(56) References Cited

U.S. PATENT DOCUMENTS 8,945,983 B2 2/2015 Liu et al.
2008/0198248 A1 8/2008 Liu
(Continued)

FOREIGN PATENT DOCUMENTS

EP 3 203 511 A1 8/2017
FR 3 053 530 A1 1/2018

OTHER PUBLICATIONS

International Search Report issued on Jun. 22, 2020 in PCT/FR2020/050531 filed on Mar. 13, 2020, 3 pages.
(Continued)

*Primary Examiner* — Mohammad M Choudhry
(74) *Attorney, Agent, or Firm* — Oblon, McClelland, Maier & Neustadt, L.L.P.

(57) ABSTRACT

A method for manufacturing a structure includes: supplying an active element provided with a front and rear face connected by a contour; assembling the front face and a main face of a support; filling a space of interconnections between the front face and the main face with glue. The method also includes, before the assembling, forming, by a method other than a plasma method, a first passivation layer covering the contour, and made from a first compound that makes it possible to limit the wetting of said contour by the glue regarding the front face and the main face.

18 Claims, 5 Drawing Sheets

(52) U.S. Cl.
CPC .............. *H01L 24/16* (2013.01); *H01L 24/29* (2013.01); *H01L 24/32* (2013.01); *H01L 24/73* (2013.01); *H01L 24/81* (2013.01); *H01L 24/92* (2013.01); *H01L 2224/13083* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/16221* (2013.01); *H01L 2224/26145* (2013.01); *H01L 2224/26175* (2013.01); *H01L 2224/2919* (2013.01); *H01L 2224/32221* (2013.01); *H01L 2224/73204* (2013.01); *H01L 2224/81193* (2013.01); *H01L 2224/81815* (2013.01); *H01L 2224/83007* (2013.01); *H01L 2224/8385* (2013.01); *H01L 2224/92125* (2013.01); *H01L 2924/0665* (2013.01)

(58) Field of Classification Search
CPC ......... H01L 24/32; H01L 24/73; H01L 24/81; H01L 24/92; H01L 2224/13083; H01L 2224/13111; H01L 2224/13139; H01L 2224/13144; H01L 2224/13147; H01L 2224/13155; H01L 2224/13166; H01L 2224/16221; H01L 2224/26145; H01L 2224/26175; H01L 2224/2919; H01L 2224/32221; H01L 2224/73204; H01L 2224/81193; H01L 2224/81815; H01L 2224/83007; H01L 2224/8385; H01L 2224/92125; H01L 2924/0665; H01L 23/293; H01L 23/3185; H01L 2224/13011; H01L 2224/13109; H01L 2224/16227; H01L 2224/32225; H01L 2224/83102

See application file for complete search history.

(56) References Cited

U.S. PATENT DOCUMENTS

| | | |
|---|---|---|
| 2011/0020983 A1 | 1/2011 | Tomura et al. |
| 2012/0119354 A1 | 5/2012 | Tsai et al. |
| 2015/0287640 A1 | 10/2015 | Tsai et al. |
| 2017/0162404 A1 | 6/2017 | Isobe |
| 2017/0229321 A1 | 8/2017 | Marion et al. |
| 2018/0212113 A1 | 7/2018 | Rantala et al. |

OTHER PUBLICATIONS

French Preliminary Search Report (with English translation of Categories of Cited Documents) issued on Nov. 29, 2019 in French Application 1903041 filed on Mar. 25, 2019, 3 pages.

Grover, J. et al., "Fast PCR Thermal Cycling Device," IEEE Sensors Journal, vol. 8, No. 5, 2008, pp. 476-487, XP011215498.

Rull, J. et al., "Functionalization of silicon oxide using supercritical fluid deposition of 3,4-epoxybutyltrimethoxysilane for the immobilization of amino-modified oligonucleotide," Applied Surface Science, vol. 354, 2015, pp. 285-297, XP029298661.

Grinenval, E. et al., "Spatially controlled immobilisation of biomolecules: A complete approach in green chemistry," Applied Surface Science, vol. 289, 2014, pp. 571-580, XP028797791.

Moulin, G. et al., "An Efficient Process of Surface Modification and Patterning for LED Encapsulation," IEEE Transactions on Components, Packaging and Manufacturing Technology, vol. 8, No. 5, 2018, pp. 904-909.

METHOD FOR MANUFACTURING A STRUCTURE

TECHNICAL FIELD

The present invention relates to a method for manufacturing a structure, and in particular a method of encapsulating a space of interconnections interposed between an active element and a support to which said element is assembled.

PRIOR ART

Three-dimensional integration, well known to those skilled in the art, has made many technological breakthroughs possible, in particular, for the improvement in the performance and the increase in the density of microelectronic and/or optronic devices.

3D integration makes it possible in particular to decrease the interconnection lengths, and consequently the density thereof, without necessarily reducing their lateral dimensions.

This technology can make use of the formation of VIAs, bumps, substrate thinning, assembly of substrates or of active elements, as well as encapsulation.

In this regard, encapsulation with a glue can be implemented in order to reinforce the mechanical strength and the reliability of an assembly that contains an active element added onto a support. The support provides a mechanical function but can also comprise CMOS functions for the integration of CMOS or detection functions (of the active element) with the CMOS functions of said support.

Encapsulation furthermore makes it possible to limit contamination at the assembly interface.

Figure 1:
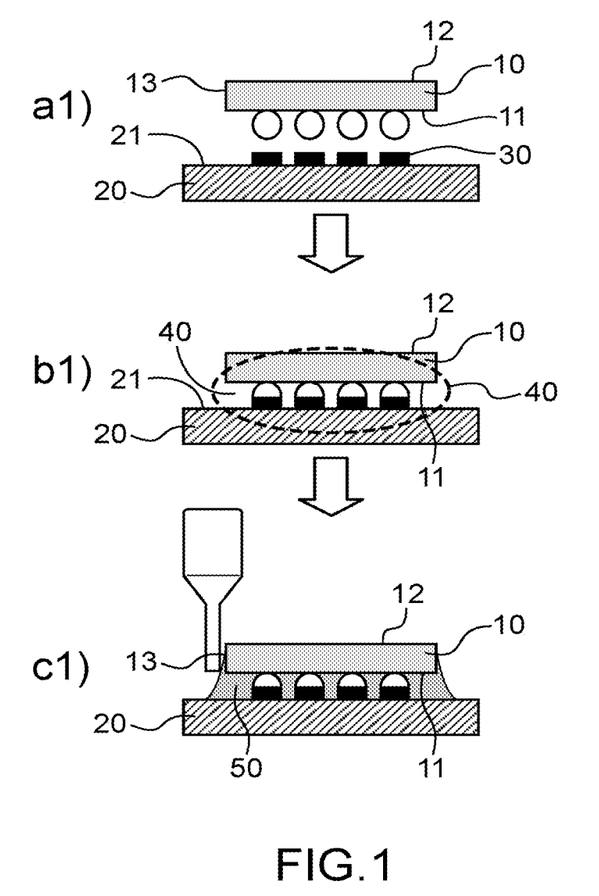
FIG. 1 diagrammatically shows different steps of a method of encapsulation known in the prior art, in particular the support and the active element are shown according to a cutting plane perpendicular to the front face.

In particular, a method of encapsulation, shown in FIG. 1 and known from the prior art, comprises the following steps:

a1) a step of supplying an active element 10 provided with a front face 11 and with a rear face 12, parallel to each other and connected by a contour 13;

b1) a step of assembling the front face 11 and a main face 21 of a support 20, with one and/or the other of the front face 11 and of the main face 21 comprising bumps 30 in projection with respect to the face or faces considered;

c1) a step of filling a space of interconnections 40 arranged, between the interconnection studs 30, between the front face 11 and the main face 21, with a glue 50.

Step c1) is generally executed by having the glue flow via capillarity into the space of interconnections.

However, this known method of the prior art is not satisfactory.

Indeed, when it spreads via capillarity, the glue creates a meniscus M (FIG. 2) that covers, at least in part, the contour 13.

Figure 2:
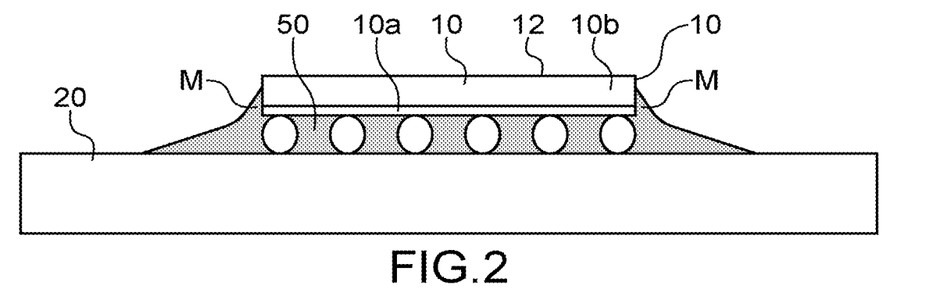
FIG. 2 shows the assembly obtained at the end of step c1) according to a cutting plane perpendicular to the front face.

This meniscus generates mechanical stresses that can tension the interconnections formed by the interconnection studs as well as the active element 10, and ultimately, cause a rupture, par pelage, of the assembly formed by the active element and the support.

Figure 3:
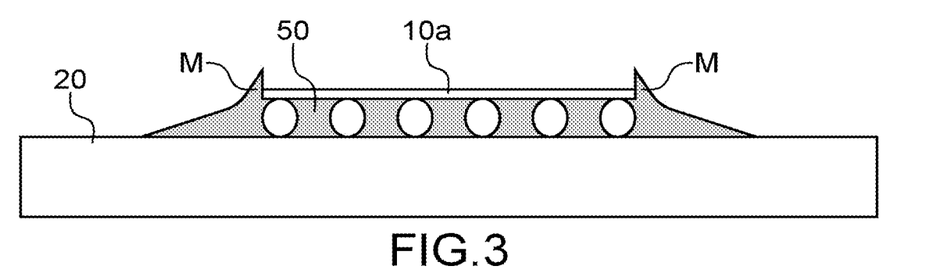
FIG. 3 shows the assembly of FIG. 2 after removal of the handle layer.

Moreover, the active element 10 can comprise, from its front face 11 to its rear face 12, an active layer 10a formed on a handle layer 10b intended to be removed at the end of step c1) (FIGS. 2 and 3).

The active layer 10a can comprise any type of device. In particular, the active layer 10a can comprise at least one of the elements chosen from: an electronic device, a microelectronic device, an optoelectronic device, a microelectromechanical system (MEMS).

The active layer 10a can, in particular, comprise one or more light-emitting structures, for example in the form of nanowires or microwires such as described in the document [1] mentioned at the end of the description.

Additional manufacturing steps can then be implemented at the active layer 10a thus exposed.

These additional manufacturing steps can in particular include the formation of colour filters involving at least one step of photolithography.

However, the step of removing the handle layer, generally executed by chemical etching or by CMP (Chemical Mechanical Polishing), leaves the meniscus M intact in such a way that the topology associated with the latter makes any step of photolithography impossible (FIG. 3).

Figure 4:
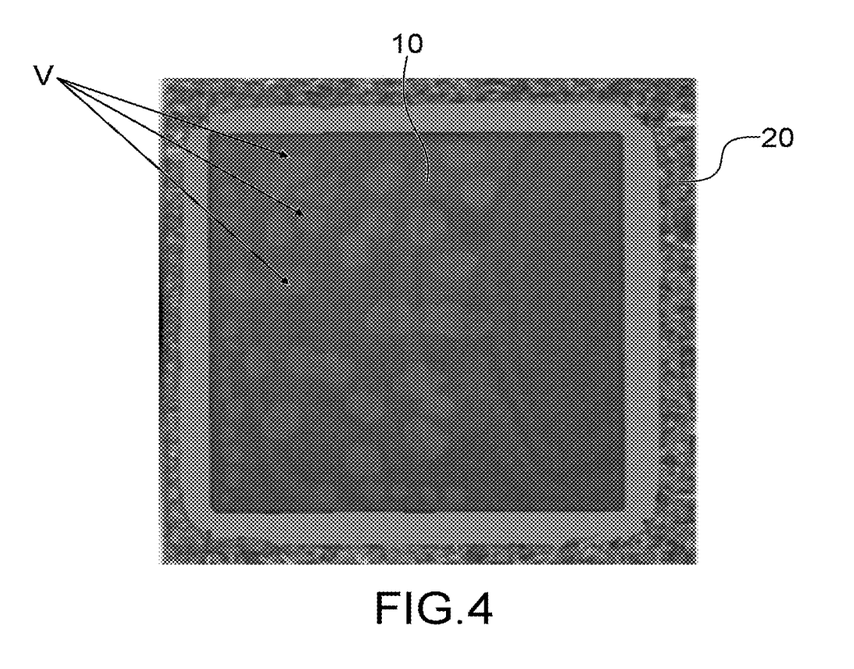
FIG. 4 is an image via Scanning Acoustic Microscopy (SAM), seen from the rear face, of the assembly formed by the active element and the support, and revealing faults, in particular voids, of filling.

Furthermore, when the surface of the active element is substantial, and in particular greater than 1 $cm^2$ (even greater than 3 $cm^2$), the capillarity force intended to activate the flowing of the glue between the front face 11 and the main face 21 is no longer sufficient in such a way that the filling is incomplete, and allows voids to appear (FIG. 4).

In order to overcome the problem concerning the partial filling or the appearance of voids, it was proposed to proceed with differentiated plasma treatments of the main and front faces on the one hand, and of the rear face and of the contour on the other hand (document [2] mentioned at the end of the description).

These treatments do not however seem to satisfactorily respond to the problem posed by the meniscus and in particular do not make it possible to reduce the topology generated by the latter in case of removing the handle layer.

In other terms, the method proposed in document [2] does not seem to be adapted to prevent, or at the very least limit, the covering, by the meniscus, of the contour of the active element.

Moreover, plasma treatments are stable only over a very short period of time that generally does not exceed a few minutes, and in particular over a timescale that corresponds to the filling time of an space of interconnection involving an active element of 1 $cm^2$.

A purpose of the present invention is therefore to propose a method of encapsulation at an assembly interface for which the covering of the contour of the active element by the meniscus is reduced relation to the known methods of the prior art.

Another purpose of the present invention is to propose a method of encapsulation at the assembly interface for which the time constraints are less severe regarding the method described in document [2] mentioned at the end of the description.

Another purpose of the present invention is to propose a method of encapsulation for which the filling by the glue between the front face and the main face is complete and without coating voids.

DISCLOSURE OF THE INVENTION

The purposes of the present invention are, at least in part, achieved by the method of manufacture of a structure comprising the following steps:

a) a step of supplying an active element provided with a front face and with a rear face, parallel to each other and connected by a contour perpendicular to said faces;

c) a step of assembling the front face and a main face of a support, with one and/or the other of the front face and of the main face comprising interconnection studs in projection in relation to the face or faces considered;

e) a step of filling a space of interconnections arranged, between the studs, between the front face and the main face, with a glue;

the method being remarkable in that it further comprises a step b), executed before step c), of forming, by a method other than a plasma method, a first passivation layer covering the contour, and made from a first compound that makes it possible to limit the wetting of said contour by the glue regarding the front face and the main face.

Thus, an interface able to be formed between the glue and the first passivation layer has an interface energy that is higher than that of an interface able to be formed between said glue and the contour devoid of the first passivation layer.

Consequently, the first passivation layer limits the covering by the glue of the contour. In other terms, the glue preferably wets the front face and the main face.

According to an embodiment, step b) starts with a masking of the front face and ends with a removal of the masking from said face.

Masking makes it possible to keep the front face intact, and thus preserve the wettability thereof by the glue. More particularly, the masking makes it possible to prevent the contamination of the interconnection studs by the first passivation layer.

According to an embodiment, the first passivation layer is also formed on the rear face.

According to an embodiment, the first passivation layer comprises a self-assembled monolayer of the first compound.

According to an embodiment, the first compound comprises a linear aliphatic chain provided with at least 6 carbon atoms.

According to an embodiment, the aliphatic chain comprises one or more fluorine substituents.

The fluorine substituent makes it possible to increase the interface energy of an interface able to be formed between the first passivation layer and the glue.

According to an embodiment, the aliphatic chain is terminated according to one of its ends by a silane function.

According to an embodiment, the silane function comprises one, two or three chlorine substituents, advantageously, the first compound comprises perfluorodecyl-trichlorosilane.

According to an embodiment, the method further comprises a step d), executed before step e), of forming a second passivation layer, by a method other than a plasma method, on the front face and the main face, and made from a second compound configured so that the interface energy between the glue and the second passivation layer is less than the interface energy between the glue and the front and main faces devoid of said second passivation layer.

The second passivation layer improves the wettability of the front face and of the main face by the glue, and thus makes it possible to consider an active element that has a substantial surface, in particular greater than 1 cm², even greater than 2 cm².

According to an embodiment, the second passivation layer is formed according to a vapour phase method after step c).

According to an embodiment, the second passivation layer comprises a self-assembled monolayer of the second compound.

According to an embodiment, the second compound comprises a linear aliphatic chain terminated according to one of its ends by an epoxy function if the glue is epoxy-based, by an amine function if the glue is amine-based.

According to an embodiment, the other end of the aliphatic chain of the second compound is terminated by a silane function.

According to an embodiment, the second compound comprises epoxybutyltrimethoxysilane.

According to an embodiment, the active element comprises from its front face to its rear face an active layer and a handle layer.

According to an embodiment, step e) is followed by a step f) of removing the handle layer in such a way as to expose the active layer.

According to an embodiment, the action layer comprises at least one light-emitting structure, and in particular light-emitting nanowires or microwires.

BRIEF DESCRIPTION OF THE DRAWINGS

Other characteristics and advantages shall appear in the following description of the method of manufacturing a structure according to the invention, given as non-limiting examples, in reference to the accompanying drawings wherein.

DETAILED DISCLOSURE OF PARTICULAR EMBODIMENTS

The present invention relates to a method of encapsulation by a glue of a space of interconnections that is interposed between an active element and a support to which said element is assembled.

In particular, the present invention implements a first passivation layer formed, by a method other than a plasma method, at least on a contour of the active element in such a way as to limit the wetting of said contour by the glue, and thus prevent the covering of the contour by a meniscus of glue that is formed in the vicinity of said contour.

FIGS. 5a to 5g diagrammatically show different steps of the method of manufacturing according to the present invention.

Figure 5A:
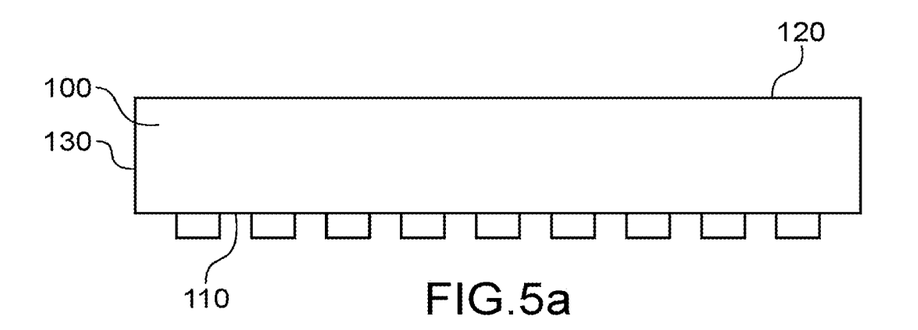
FIGS. 5a, 5b, 5c, 5d, 5e, 5f and 5g diagrammatically show different steps able to be implemented during the execution of the method according to the present invention.
Figure 5B:
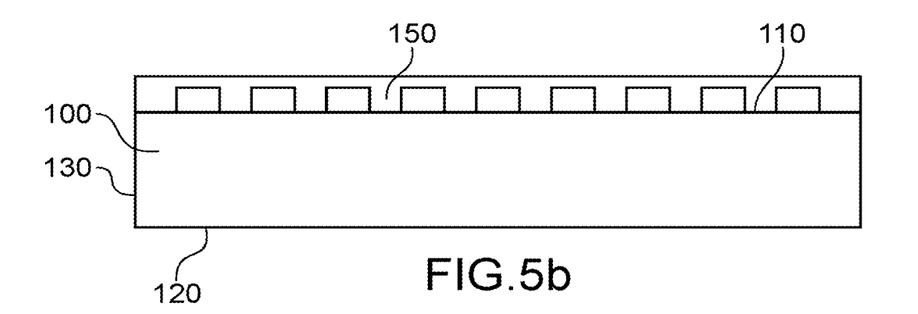

The method comprises in particular a step of supplying an active element 100 that comprises two substantially parallel faces called, respectively, front face 110 and rear face 120 (FIG. 5a).

The front face 110 and the rear face 120 are moreover connected by a contour 130.

"Contour" means a surface, with a break in the slope with respect to the faces that it connects.

The active element can comprise an electronic device, or an optoelectronic device, or an optical device.

The device, in an example of which details will be provided hereinafter in the description, can comprise from its front face 110 to its rear face 120 an active layer formed on a handle layer.

The handle layer can comprise a semi-conductor material, in particular silicon.

Figure 5C:
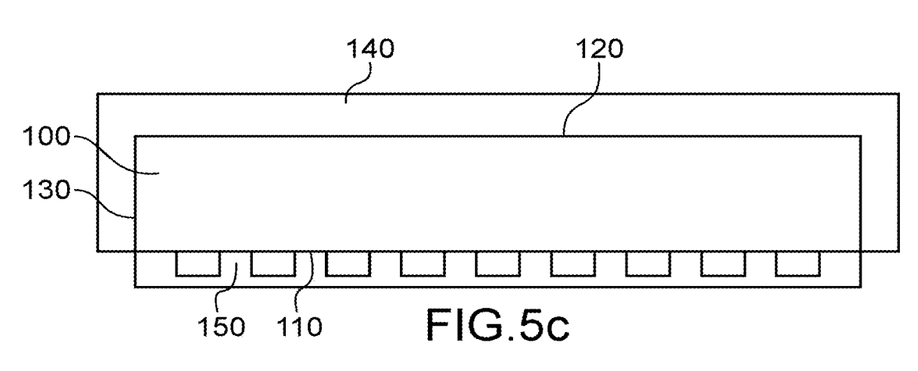
Figure 5D:
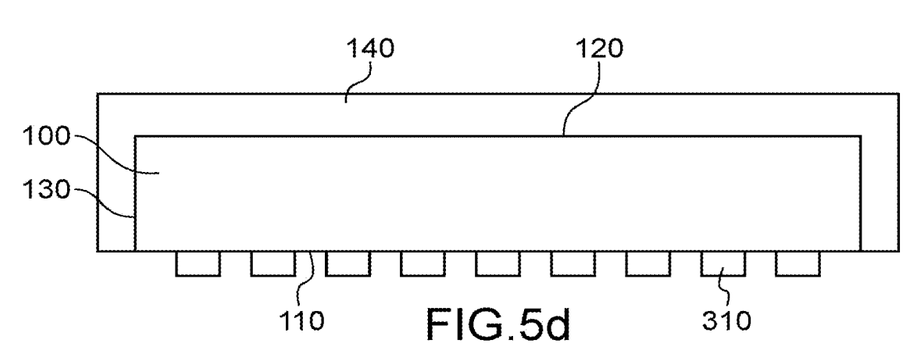

The method also comprises a step b) of forming a first passivation layer 140 on the contour 130 and optionally on the rear face 120 (FIG. 5c). Step b) can start with a masking 150 (FIG. 5b) of the front face 110 and end with a removal of said masking (FIG. 5d).

Figure 5E:
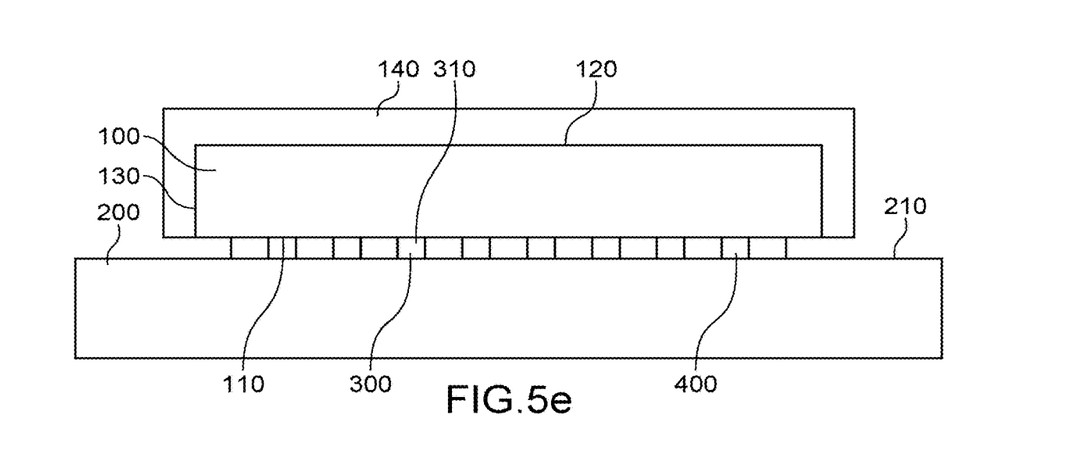

The method also comprises a step c) of assembling the front face 110 with a main face 210 of a support (FIG. 5e).

The support 200 can comprise, in projection with respect to the main face 210, interconnection studs 300.

The active element 100 can comprise metal studs or metal bumps 310 ("UBM" or "under bump metallurgy"), in projection with respect to the front face 110, and in correspondence with the interconnection studs 300 (or other bumps) in such a way that a contact is established, during the assembly, between each stud and the metal bump facing it.

The interconnection studs can include copper pillars, indium or indium alloy balls, tin or tin alloy balls, micro tubes.

By way of example, 450,000 studs 300, of 20 µm in height and according to a pitch of 30 µm, are formed on a main face 210 of 4 cm². The studs 300 include in particular a stack of copper, of nickel and of a tin-silver alloy (SnAg).

Still according to this example, 450,000 metal bumps 310, comprising a titanium and nickel alloy as well as gold, are formed on a front face 110 of 4 cm¹, and according to a disposition making it possible to establish an electrical contact between studs and bumps.

During the step of assembly c), the melting of the SnAg alloy of the studs 300, caused by a heating, makes it possible to wet the metal bumps and establish the electrical connections between each stud 300 and the bump 310 facing it.

The interconnection studs 300 and the metal bumps 310 in projection, respectively, with respect to the main face 210 and the front face 110 arrange a space of interconnections 400 between said faces at the end of step c).

Figure 5F:
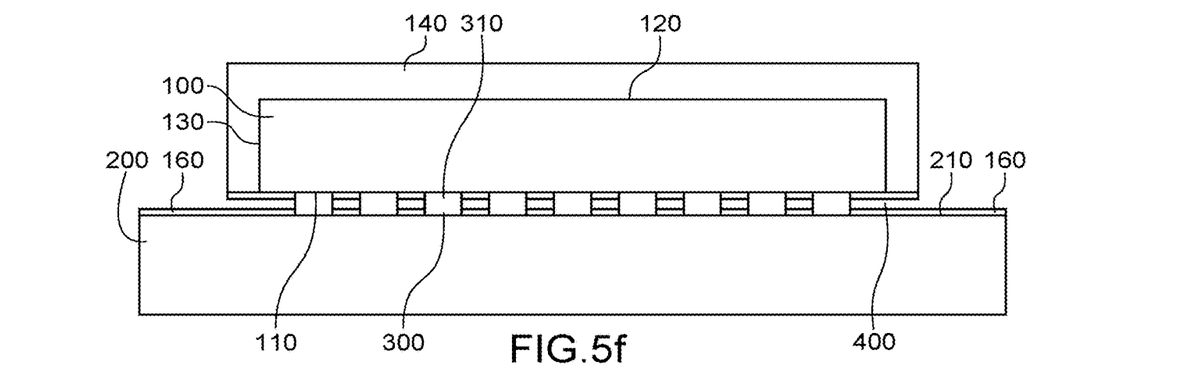
Figure 5G:
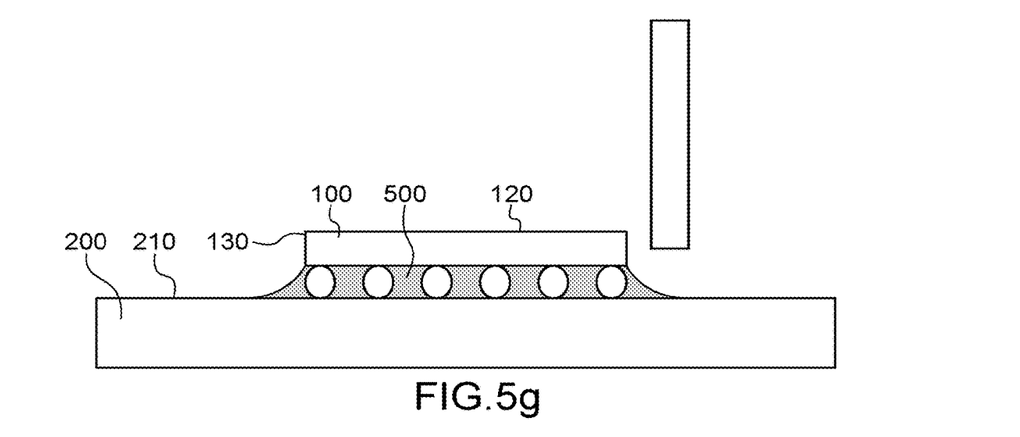

This space of interconnections 400 is then filled in with a glue 500 (step e)). The glue 500 is in particular deposited, for example using a needle 600, in the vicinity of the contour 130, on the main face 210, and spreads via capillarity into the space of interconnections between the interconnection studs 300 and the metal bumps 310.

According to the present invention, the first passivation layer 140 is made from a first compound making it possible to limit the wetting of the contour 130 by the glue 500 regarding the front face 110 and the main face 210.

In other terms, an interface able to be formed between the glue 500 and the first passivation layer has an interface energy greater than that of an interface able to be formed between said glue 500 and the contour 130 devoid of the first passivation layer.

Consequently, the first passivation layer limits the covering of the contour by the meniscus of glue 500.

Advantageously, the first passivation layer comprises a self-assembled monolayer of the first compound.

In this respect, the first compound can comprise a linear aliphatic chain provided with at least 6 carbon atoms. This aliphatic chain can comprise one or more fluorine substituents.

The aliphatic chain of the first compound can be terminated according to one of its ends by a silane function. The silane function can comprise one, two or three chlorine substituents.

Particularly advantageously, the first compound comprises perfluorodecyltrichlorosilane (FDTS).

The formation of the first passivation layer, and in particular of a layer made from FDTS, makes use of techniques known to those skilled in the art which are described in document [3] mentioned at the end of the description.

The layers formed by these silane compounds, relatively stable over time, allow for better management of the chaining of the manufacturing steps.

Moreover, these same layers, thermally resistant, are not affected by the heating that can be imposed during step c).

The method according to the present invention can also include a step d), executed before step e), of forming a second passivation layer 160 on the front face 110 and on the main face 210.

The second passivation layer, formed by a method other than a plasma method, is made from a second compound configured so that the interface energy between the glue 500 and the second passivation layer 160 is less than the interface energy between the glue 500 and the front 110 and main 210 faces devoid of said second passivation layer 160.

Thus, the second passivation layer 160 makes it possible to improve the wetting by the glue of the front face 110 and of the main face 210, and consequently favour the flow via capillarity of the glue 500 in the space of interconnections 400.

This improvement in the wetting by the glue also makes it possible to limit, and even to prevent, the formation of voids.

The implementation of the second passivation layer 160 also makes it possible to consider an active element 100 of large surface, and in particular having a surface comprised between 1 cm² and 4 cm², even greater than 4 cm².

The second passivation layer 160 can be formed according to a vapour phase method after step c).

The second passivation layer 160 can comprise a self-assembled monolayer of the second compound.

The second compound can comprise a linear aliphatic chain terminated according to one of its ends by an epoxy function if the glue is epoxy-based, by an amine function if the glue is aminebased.

The other end of the aliphatic chain of the second compound can be terminated by a silane function.

Particularly advantageously, the second compound comprises epoxybutyltrimethoxysilane (EBTMOS).

The formation of the second passivation layer, and in particular of a layer made from EBTMOS, makes use of techniques known to those skilled in the art which are described in documents [4] and [5] mentioned at the end of the description.

Such a compound makes it possible to considerably reduce the drop angle of the glue 500 on the front face and the main face, and therefore to improve the wettability of said surfaces by the glue 500.

By way of example, the table given hereinafter gives a drop angle (in "°") for different types of epoxy glues on a surface covered with a layer of EBTMOS, and on the same surface that is not covered with a layer of EBTMOS.

| type of glue | Surface covered with a layer of EBTMOS | Surface not covered with a layer of EBTMOS |
|---|---|---|
| XS 8410-302 | 17 | 37 |
| PB 181084 360 | 12 | 33 |
| PB 176152 301 | 16 | 32 |
| OD 2002 | 29 | 38 |

Moreover, the wetting of the first passivation layer by the second element is highly unfavourable in such a way that no masking of the first layer is required during the formation of the second layer 160.

Thus, the combined implementation of the first passivation layer 140 and of the second passivation layer 160 also makes it possible to simplify the method of manufacturing according to the present invention.

Figure 6A:
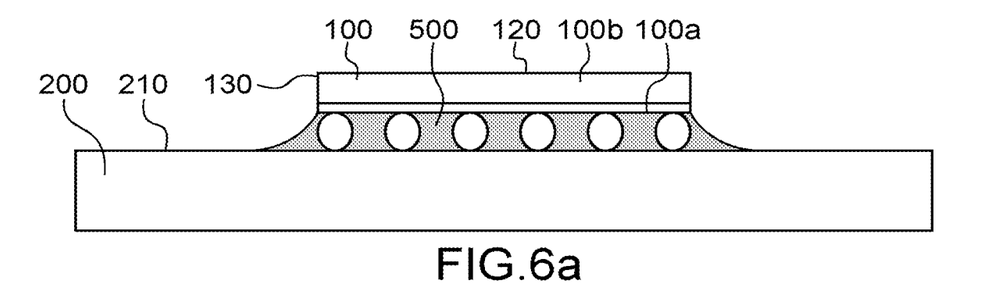
FIGS. 6a and 6b diagrammatically show steps that can be implemented during the execution of the method according to the present invention, and involving in particular the removal of a handle layer.
Figure 6B:
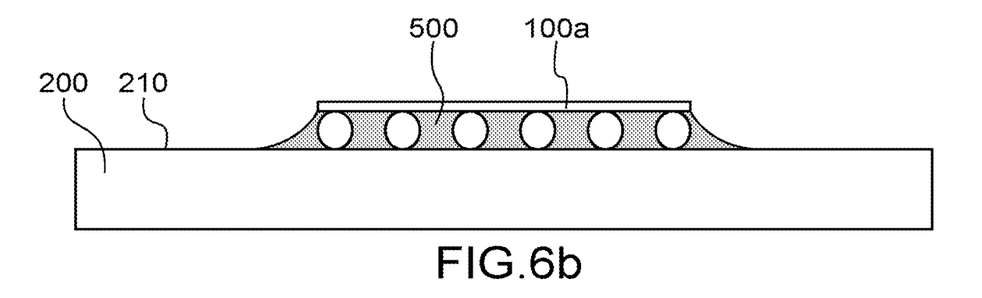

According to a particularly advantageous embodiment, the active element 100 can comprise from its front face 110 to its rear face 120 an active layer 100a and a handle layer 100b intended to be removed during a step f), at the end of step e), in such a way as to expose the active layer 100a (FIGS. 6a and 6b).

The active layer 100a can comprise any type of device. In particular, the active layer 10a can comprise at least one of the elements chosen from: an electronic device, a microelectronic device, an optoelectronic device, a microelectromechanical system (MEMS).

Particularly advantageously, the active layer 100a can comprise at least one light-emitting structure.

In particular, the light-emitting structure can comprise nanowires or microwires such as those described in document [1] mentioned at the end of the description.

The method according to the present invention makes it possible to prevent any topology induced by the meniscus at the end of the step of removing the handle layer 100b.

It is thus possible to execute additional manufacturing steps, and in particular steps of photolithography, at the level of the active layer.

REFERENCES

[1] FR 3 053 530
[2] U.S. Pat. No. 8,945,983
[3] G. Moulin et al., "An Efficient Process of Surface Modification and Patterning for LED Encapsulation", IEEE TRANSACTIONS ON COMPONENTS, PACKAGING AND MANUFACTURING TECHNOLOGY, VOL. 8, NO. 5, May 2018
[4] Eva Grinenval et al., "Spatially controlled immobilisation of biomolecules: A complete approach in green chemistry", Applied Surface Science 289 (2014) 571-580
[5] Jordi Rull et al., "Functionalization of silicon oxide using supercritical fluid deposition of 3,4-epoxybutyltrimethoxysilane for the immobilization of amino-modified oligonucleotide", Applied Surface Science 354 (2015) 285-297

The invention claimed is:

1. A method for manufacturing a structure comprising:
   a) supplying an active element provided with a front face and with a rear face, parallel to each other and connected by a contour;
   c) assembling the front face and a main face of a support, the front face or the main face comprising interconnection studs in projection with respect to the front face or to the main face, respectively; and
   e) filling a space of interconnections arranged, between the studs, between the front face and the main face, with a glue,
   the method further comprising b) forming, before c), by a method other than a plasma method, a first passivation layer covering the contour, and made from a first compound that makes it possible to limit the wetting of said contour by the glue regarding the front face and the main face, and
   the method further comprising d) forming, before e), a second passivation layer, by a method other than a plasma method, on the front face and the main face, and made from a second compound configured so that the interface energy between the glue and the second passivation layer is less than the interface energy between the glue and the front and main faces devoid of said second passivation layer.

2. The method according to claim 1, wherein b) starts with a masking of the front face and ends with a removal of the masking from said front face.

3. The method according to claim 1, wherein the first passivation layer is also formed on the rear face of the active element.

4. The method according to claim 1, wherein the first passivation layer comprises a self-assembled monolayer of the first compound.

5. The method according to claim 1, wherein the first compound comprises a linear aliphatic chain provided with at least 6 carbon atoms.

6. The method according to claim 5, wherein the aliphatic chain comprises one or more fluorine substituents.

7. The method according to claim 5, wherein the aliphatic chain is terminated according to one of its ends by a silane function.

8. The method according to claim 7, wherein the silane function comprises one, two or three chlorine substituents.

9. The method according to claim 7, wherein the silane function comprises one, two or three chlorine substituents and the first compound comprises perfluorodecyltrichlorosilane.

10. The method according to claim 1, wherein the second passivation layer is formed according to a vapour phase method after c).

11. The method according to claim 10, wherein the second passivation layer comprises a self-assembled monolayer of the second compound.

12. The method according to claim 10, wherein the second compound comprises a linear aliphatic chain terminated according to one of its ends by an epoxy function when the glue is epoxy-based, by an amine function when the glue is amine-based.

13. The method according to claim 12, wherein the other end of the aliphatic chain of the second compound is terminated by a silane function.

14. The method according to claim 13, wherein the second compound comprises epoxybutyltrimethoxysilane.

15. The method according to claim 1, wherein the active element comprises from the front face to the rear face an active layer and a handle layer.

16. The method according to claim 15, wherein e) is followed by f) removing the handle layer in such a way as to expose the active layer.

17. The method according to claim 16, wherein the active layer comprises at least one light-emitting structure.

18. The method according to claim 16, wherein the active layer comprises light-emitting nanowires or microwires.

* * * * *